US010312415B2

(12) United States Patent
Holbery et al.

(10) Patent No.: US 10,312,415 B2
(45) Date of Patent: Jun. 4, 2019

(54) FLEXIBLE ELECTRONIC ASSEMBLY WITH SEMICONDUCTOR DIE

(71) Applicant: Microsoft Technology Licensing, LLC, Redmond, WA (US)

(72) Inventors: James David Holbery, Bellevue, WA (US); Siyuan Ma, Bothell, WA (US); Benjamin Sullivan, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/627,215

(22) Filed: Jun. 19, 2017

(65) Prior Publication Data

US 2018/0366619 A1 Dec. 20, 2018

(51) Int. Cl.

| H01L 33/48 | (2010.01) |
|---|---|
| H01L 33/50 | (2010.01) |
| H01L 33/62 | (2010.01) |
| H01L 33/00 | (2010.01) |
| H01L 25/075 | (2006.01) |
| H05K 3/28 | (2006.01) |

(Continued)

(52) U.S. Cl.
CPC ........ *H01L 33/483* (2013.01); *H01L 25/0753* (2013.01); *H01L 33/0095* (2013.01); *H01L 33/505* (2013.01); *H01L 33/62* (2013.01); *H05K 3/284* (2013.01); *H01L 33/20* (2013.01); H01L 2933/005 (2013.01); H01L 2933/0066 (2013.01); H05K 1/0366 (2013.01); H05K 2201/10106 (2013.01); H05K 2203/1311 (2013.01)

(58) Field of Classification Search
CPC . H01L 33/483; H01L 33/0095; H01L 33/505; H01L 33/62
See application file for complete search history.

(56) References Cited

U.S. PATENT DOCUMENTS

| 4,774,434 A | 9/1988 | Bennion |
| 6,045,575 A | 4/2000 | Rosen et al. |
| 7,259,033 B2 | 8/2007 | Slater, Jr. et al. |

(Continued)

FOREIGN PATENT DOCUMENTS

| DE | 202005004255 U1 | 10/2005 |
| WO | 2009037667 A2 | 3/2009 |

OTHER PUBLICATIONS

Kunimune, et al., "High-Conductivity Adhesive for Light-Emitting Diode Die-Attachment by Low-Temperature Sintering of Micrometer-Sized Ag Particles", In Journal of IEEE Transactions on Components, Packaging and Manufacturing Technology, vol. 2, Issue 6, Jun. 2012, 4 pages.

(Continued)

*Primary Examiner* — Selim U Ahmed
(74) *Attorney, Agent, or Firm* — Alleman Hall Creasman & Tuttle LLP

(57) ABSTRACT

An electronic assembly comprises a flexible polymer membrane having a surface with one or more electrically conductive traces arranged on the surface, a light-emissive semiconductor die having first and second electrical contacts bonded to the one or more electrically conductive traces via a cured electrically conductive adhesive, and a flexible cover layer arranged over the surface of the polymer membrane and the semiconductor die.

14 Claims, 4 Drawing Sheets

(51) Int. Cl.
*H01L 33/20* (2010.01)
*H05K 1/03* (2006.01)

(56) References Cited

U.S. PATENT DOCUMENTS

| | | |
|---|---|---|
| 8,886,334 B2 | 11/2014 | Ghaffari et al. |
| 9,482,416 B2 | 11/2016 | Narag et al. |
| 2002/0076948 A1 | 6/2002 | Farrell et al. |
| 2003/0194831 A1 | 10/2003 | Ng et al. |
| 2010/0065873 A1 | 3/2010 | Bhattacharya et al. |
| 2010/0084759 A1 | 4/2010 | Shen |
| 2012/0112368 A1* | 5/2012 | Gorai .................. B81C 1/0023 257/782 |
| 2012/0118427 A1 | 5/2012 | Brookstein et al. |
| 2013/0027963 A1 | 1/2013 | Van herpen et al. |
| 2013/0111744 A1 | 5/2013 | Tischler et al. |
| 2014/0170920 A1 | 6/2014 | Manipatruni et al. |
| 2014/0334113 A1 | 11/2014 | Van os et al. |
| 2016/0218257 A1 | 7/2016 | Ray et al. |
| 2016/0218264 A1* | 7/2016 | Tischler ................. H01L 33/62 |
| 2016/0240517 A1 | 8/2016 | Kim et al. |
| 2017/0040306 A1* | 2/2017 | Kim ...................... H01L 25/167 |

OTHER PUBLICATIONS

"TexOLED: Textile-Integrated and Textile-Based LEDs and OLEDs" Fraunhofer Institute for Reliability and Microintegration IZM, retrieved at <<https://www.izm.fraunhofer.de/content/dam/izm/en/documents/Abteilungen/System_Integration_Interconnection_Technologies/TexLab/TexOLED.pdf>> retreived on Jun. 14, 2017,3 pages.

"Introducing Levi's Commuter/Jacquard by Google Technology Woven In", retrieved from <<http://www.levi.com/US/en_US/features/levi-commuter-xgoogle-jacquard/>> Retrieved on May 26, 2017; 2 pages.

"International Search Report and Written Opinion Issued in PCT Application No. PCT/US2018/034247", dated Sep. 11, 2018, 15 Pages.

* cited by examiner

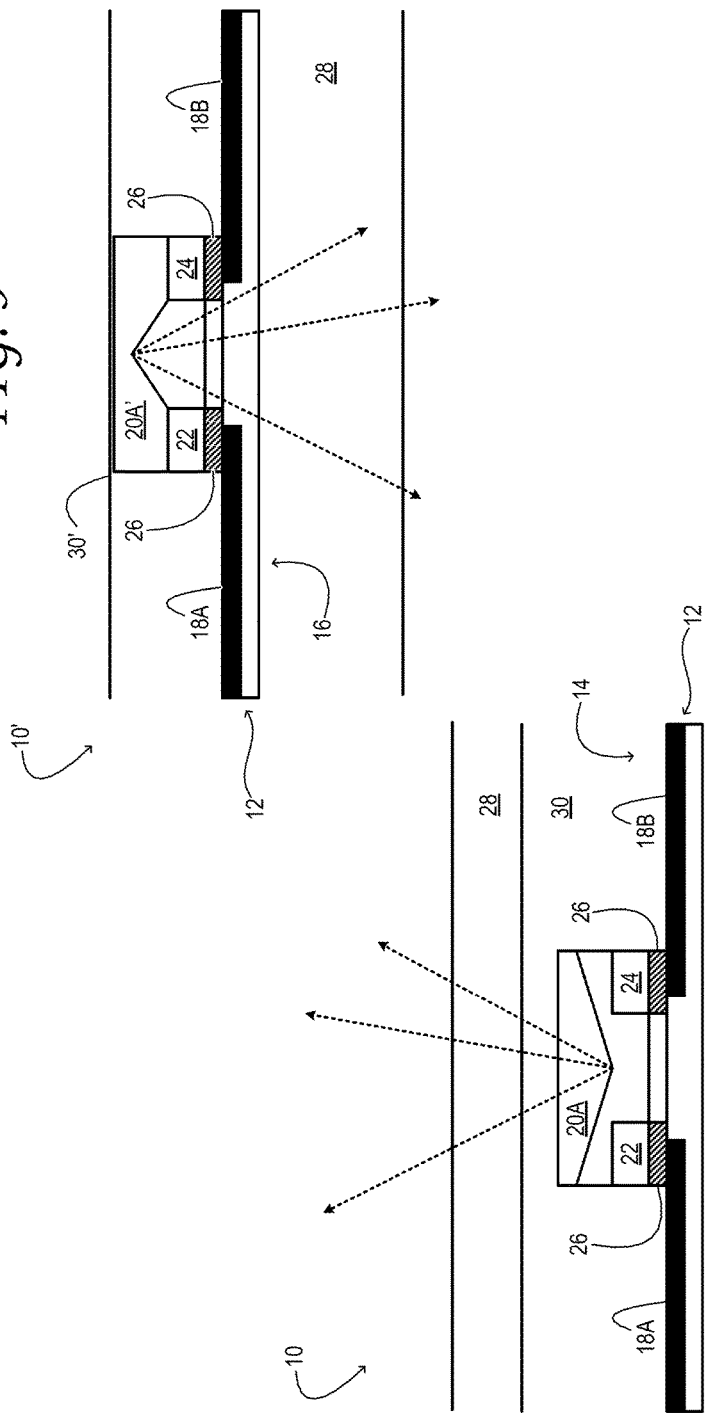

FLEXIBLE ELECTRONIC ASSEMBLY WITH SEMICONDUCTOR DIE

BACKGROUND

Electronic circuits are often formed on rigid circuit boards and housed in rigid enclosures. Some devices may utilize flexible conductors to accommodate large-scale movement of components relative to one another. An example of such a configuration is a ribbon cable running from a controller to a print head of an inkjet printer.

SUMMARY

Examples are disclosed that relate to an electronic assembly comprising a flexible polymer membrane having a surface with one or more electrically conductive traces arranged on the surface, a light-emissive semiconductor die having first and second electrical contacts bonded to the one or more electrically conductive traces via a cured electrically conductive adhesive; and a flexible cover layer arranged over the surface of the polymer membrane and the semiconductor die.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 2 shows aspects of an example light-emissive semiconductor die of a fabric-based electronic assembly.

FIG. 3 shows aspects of another example light-emissive semiconductor die of a fabric-based electronic assembly.

DETAILED DESCRIPTION

Rigid circuit boards, conventional ribbon cables, and other current circuit components may be less well-suited for flexible electronic devices than for traditional electronic devices. For example, some wearable electronics may take the form of a soft article (e.g., a fabric article) configured to be comfortably worn on the body. When incorporated into such articles, rigid circuit boards may be noticeable to both an observer and to a wearer, and may negatively impact both device comfort and appearance. Further, some wearable electronic devices may need to withstand repeated cycles of being put on and taken off, bumping into objects, being folded and washed, etc. Other fabric-based electronic devices (e.g., devices arranged in furniture, bandages, or prosthetics), may be exposed to similarly challenging use environments.

Figure 1:
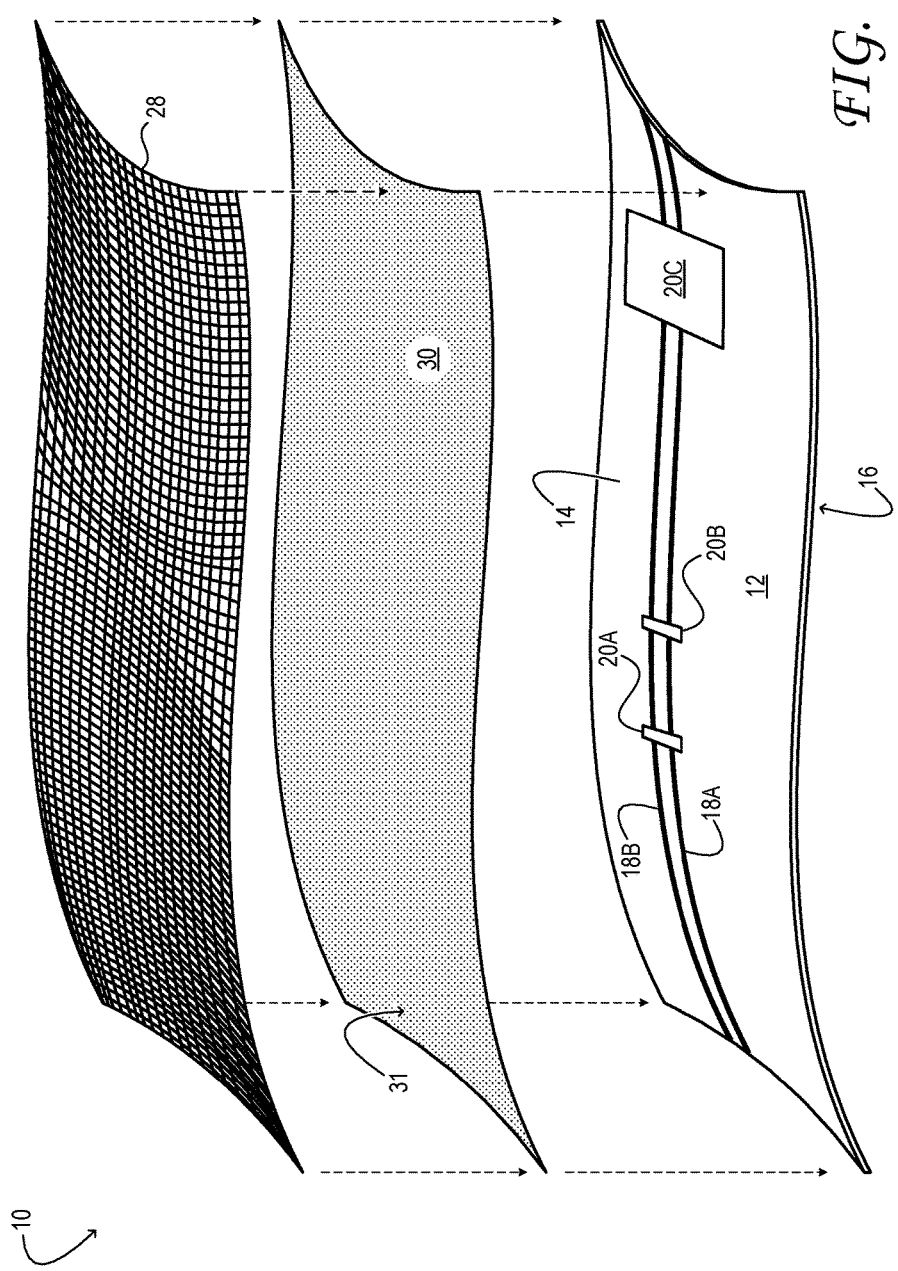
FIG. 1 shows aspects of an example flexible, fabric-based electronic assembly.

Accordingly, examples are disclosed that relate to fabric-based electronic device structures that may help to address such problems. FIG. 1 shows an example of a fabric-based electronic assembly 10. In some examples, the fabric-based electronic assembly may be a component of functional apparel—i.e., clothing equipped with light-emissive electronics, electronic sensors, and/or transducers. Electronic assembly 10 includes a flexible polymer membrane 12. The polymer membrane may have any suitable thickness, and be made of any suitable material. In some examples, the polymer membrane may be 75 to 125 microns (μm) thick, and may be formed from polyimide and/or polyethylene terephthalate. Thinner membranes, down to 12 μm and below are also envisaged. In other examples, other suitable materials having other suitable thicknesses may be used.

Polymer membrane 12 comprises a first surface 14 and a second surface 16 opposing the first surface. One or more electrically conductive traces may be arranged on either or both of the opposing surfaces of the polymer membrane. In the illustrated example, electrically conductive traces 18A and 18B are arranged on first surface 14. The electrically conductive traces may be configured to supply electric current to discrete electronic components arranged on the polymer membrane (vide infra), or to convey electronic signals among the discrete electronic components. The electrically conductive traces may also be configured to improve thermal management and the signal-to-noise ratio (SNR) in complex systems, and to provide efficient, low-noise grounding. Example compositions of the electrically conductive traces are described below.

Continuing in FIG. 1, electronic assembly 10 may include one or more semiconductor dies arranged on polymer membrane 12. In the example shown in FIG. 1, the electronic assembly includes semiconductor dies 20A, 20B, and 20C. While shown as connected to traces 18A and 18B in parallel, in other examples, each semiconductor die may comprise a separate signal trace. In such an example, where the semiconductor dies are light-emitting dies, an individually indexable array of light-emitting dies may be formed.

FIG. 2 shows example aspects of semiconductor die 20A in greater detail. The semiconductor die includes a first electrical contact 22 and a second electrical contact 24. The first and second electrical contacts may correspond to the source and sink, respectively, of electric current passing through the semiconductor die when the semiconductor die is in operation. First electrical contact 22 and second electrical contact 24 are bonded to electrically conductive traces 18A and 18B via a cured electrically conductive adhesive 26. The cured electrically conductive adhesive may have any suitable composition. In some examples, the cured electrically conductive adhesive may include electrically conductive particles—e.g., silver or carbon—immobilized in a cured polymer matrix. The cured polymer matrix may be a urethane, acrylate, or polysiloxane matrix, for example. As described in further detail below, the cured electrically conductive adhesive is formed by applying partially cured adhesive in the desired locations on polymer membrane 12 prior to placement of the semiconductor dies, and then curing the partially cured adhesive to secure the semiconductor dies to the polymer membrane.

In some examples, electrically conductive traces 18 may themselves be formed, at least partially, from the cured electrically conductive adhesive. In other examples, the electrically conductive traces may be distinct from the cured electrically conductive adhesive described above. For instance, the electrically conductive traces may be formed from a different kind of cured conductive paste or paint (e.g., one that is fully cured in a single step). In yet other examples, the electrically conductive traces may be formed from a film, foil or other thin layer of a highly electrically conductive and malleable metal-copper, nickel or gold, as examples.

Electronic assembly 10 also includes a cover textile 28, aspects of which are shown in FIGS. 1 and 2. The cover textile may be an article of clothing or furniture, or a portion thereof. In other examples, the cover textile may correspond to the outer surface of a computing device (a fabric-covered laptop computer, handheld mobile device, keyboard, etc.), or virtually any other electronic device. In the configuration shown in FIG. 1, cover textile 28 is arranged on first surface 14 of polymer membrane 12, over semiconductor dies 20A, 20B, and 20C. Electronic assembly further includes an encapsulant layer 30, as described in more detail below.

Semiconductor die 20A may, in some examples, be a light-emissive semiconductor die. As a more specific example, the semiconductor die may include (as shown in FIG. 2) a lensless, unpackaged, non-encapsulated light-emitting diode (LED) or micro-LED. A semiconductor micro-LED die may be approximately 50 to 80 µm thick and 100 to 400 µm on edge, in some examples. Other die dimensions are equally envisaged. The cover textile may be configured to be at least partly transmissive to the light emitted by the semiconductor die. For example, the cover textile may be a woven fabric configured to transmit the light emitted by the semiconductor die through openings in the weave. Encapsulant layer 30 of FIG. 1 is configured to protect traces 18 and semiconductor dies 20A, 20B, 20C from damage, moisture, etc., and also may bond cover textile 28 to polymer membrane 12. In examples in which the encapsulant layer is insufficiently adhesive, and additional adhesive layer may be applied over the encapsulant layer. In some examples, encapsulant layer 30 may be optically transparent. Further, in some examples, encapsulant layer 30 may be a hydrophobic adhesive encapsulant layer configured not only to bond the cover textile to the polymer membrane, but also to protect the semiconductor dies from water and/or detergent. Encapsulant layer 30 may be formed from any suitable material or materials. In some examples, encapsulant 30 layer may comprise a polyurethane or acrylic thermo-plastic film. Such a layer may be press-fit between polymer membrane 12 and cover textile 28 using heated plates and applied pressure (akin to a t-shirt press, for example. In other examples, a separate adhesive layer may be used to bond encapsulant layer 30 to cover textile 28.

The configuration of FIGS. 1 and 2 may be used, inter alia, for a light-emissive semiconductor die 20A in which first electrical contact 22 and second electrical contact 24 are arranged opposite the light-emissive surface of the die—e.g., a 'flip-chip' configuration. Here, emission from the die is transmitted through cover textile 28. In this embodiment, a sufficiently transparent or translucent encapsulant layer 30 may be used to prevent excessive loss of luminance through the structure.

FIG. 3 shows another example configuration. In electronic assembly 10', both the first and second electrical contacts of semiconductor die 20A are arranged on the light-emissive side of the die. Cover textile 28 is now bonded to second surface 16 of polymer membrane 12. In this configuration, an encapsulant layer 30' is applied to the back side of the die, to protect the mounted dies and conductive traces from moisture, and mechanical and environmental stress. In some examples, the encapsulant layer 30' may include a spray-on polymer coating. In some examples, the encapsulant may comprise a polysiloxane, such as OE6330 or OE77662, available from Dow Corning Corporation of Midland, Mich., or a polyurethane encapsulant material. In other examples, any other suitable material may be used. In some examples, encapsulant layer 30' may be an adhesive that secures an additional cover textile to first surface 14 of the polymer membrane, or may include a separate adhesive layer.

Returning briefly to FIG. 1, in some implementations, at least one of encapsulant layer 30 and encapsulant layer 30' may include a color-conversion filling 31 (represented as a pattern of dots in the adhesive encapsulant layer). The color-conversion filling may comprise a distributed phosphor powder or dispersion of quantum dots, for example. The color-conversion filling may be used in examples in which the attached LED dies are substantially monochrome emitters (red, green, or blue, for example), but other emission colors are desired. Thus, the color-conversion filling may receive blue light from the LED dies and release substantially white light, by converting some of the blue light into red and green light. In one more specific example, a color-conversion filling comprising an yttrium-aluminum garnet (YAG) phosphor powder may be distributed in a polysiloxane encapsulant for color conversion. In another example a mixture of quantum dots (e.g. II/VI quantum dots such as CdSe and/or CdTe, and/or III/V quantum dots such as InP and/or GaP) having desired emission spectra may be distributed in such an encapsulant for color conversion. In still other examples, a plurality of encapsulant layers may be arranged in a layered structure, with each layer tailored to one or more specific functions—e.g., adhesive, color-conversion, protective encapsulation.

No aspect of the foregoing drawings or description should be interpreted in a limiting sense, for numerous variations, extensions, and omissions are also envisaged. In some examples, for instance, a flexible, non-textile cover layer may be used in place of, or in addition to, cover textile 28.

In configurations where overall flexibility of electronic assembly 10 is desired, the cover layer must be flexible. Cover layers consonant with this disclosure include not only the cover textile 28 described above, but also various non-woven fabrics and flexible layers formed by casting, such as silicone layers. In some examples, the cover layer may be optically diffusive, so that the emission from a light-emissive semiconductor die is spread over an extended angular range. The cover layer may also include imbedded lenslets or other refractive features, to guide the emitted light, as dictated by the end use of electronic assembly 10. An electronic assembly of this kind may be arranged behind a key cap on an illuminated keyboard, for instance, or on a band or finger clip as a component of a blood-oxygen sensor, pulse sensor, or other health monitor.

Figure 4:
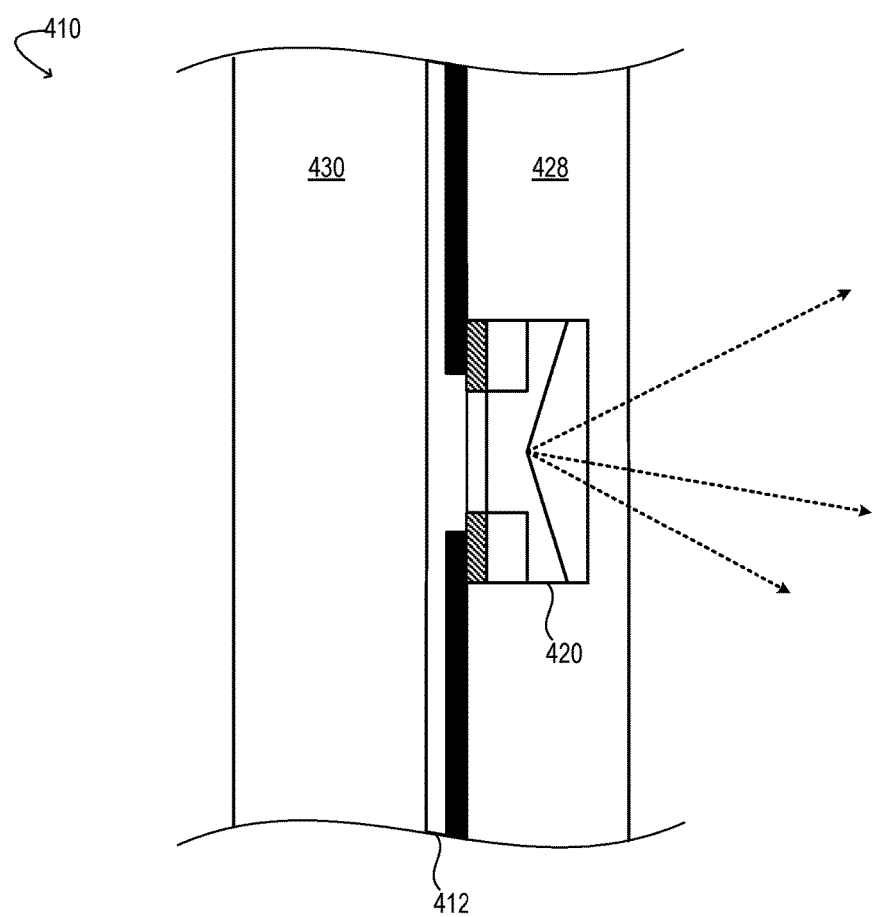
FIG. 4 shows aspects of a flexible, fabric-based electronic assembly in another example.
Figure 5:
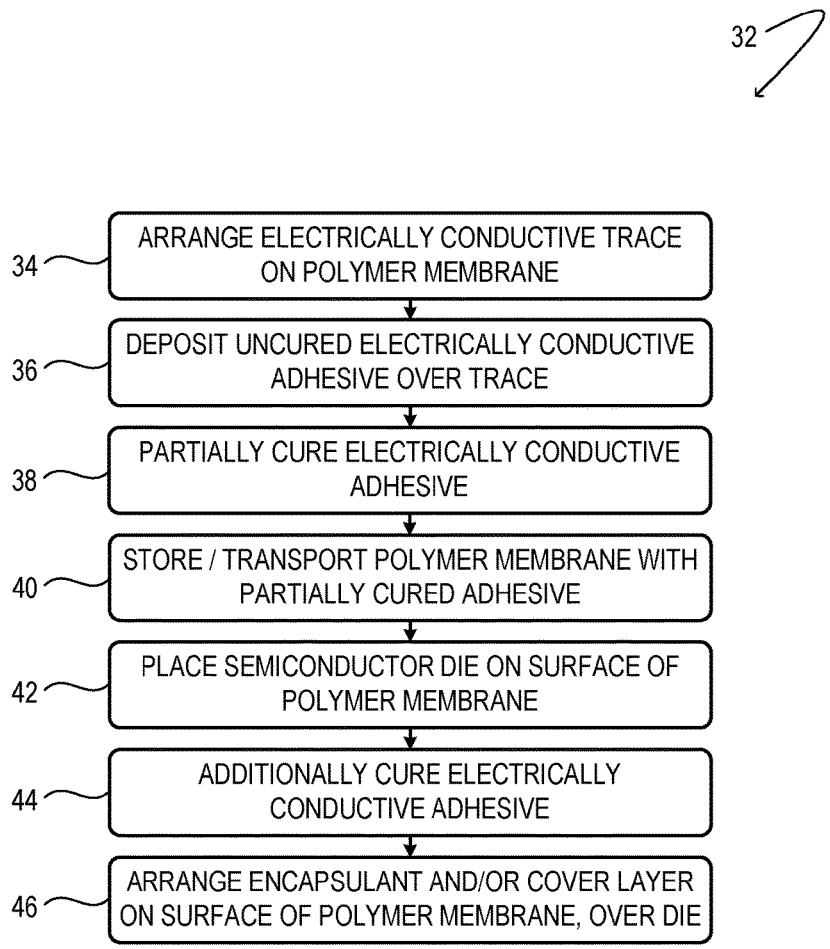
FIG. 5 illustrates an example method of manufacturing a flexible electronic assembly.

Although FIG. 1 shows a single cover layer in the form of cover textile 28, configurations covered on both sides are also envisaged. FIG. 4, for example, shows a flexible electronic assembly 410 in which a first cover textile 428 is bonded to a first surface of polymer membrane 412 supporting an LED die 420, and a second cover textile 430 is bonded to a second surface of polymer membrane 412. Finally, although the electronic assemblies illustrated above include a light-emissive semiconductor die, other suitable components may be incorporated into an article similarly. Examples include dies supporting sensory components such as photodiodes, phototransistors, ionizing radiation sensors, and audio transducers.

FIG. 4 illustrates an example method 32 of manufacturing an electronic assembly. The method includes the mounting of a semiconductor die on a polymer membrane and employs a b-staging principle in order to avoid shorting of the electrical contacts of the semiconductor die, which, in the case of LED dies may be separated by as little as 90 µm. Method 32 offers the additional advantage of preserving the very low profile of the semiconductor die even after mounting, enabling the manufactured electronic assembly to be incorporated into clothing without sacrificing user comfort.

At 34 of method 32, one or more electrically conductive traces is arranged on a surface of a polymer membrane. At 36 an uncured electrically conductive adhesive is deposited over the one or more electrically conductive traces on the surface of the polymer membrane. At 38 the uncured electrically conductive adhesive is partially cured to form a partially cured electrically conductive adhesive. In one embodiment, partial curing may involve heating the assembly to 150° C. for 20 minutes, or to 60 to 80° C. with an appropriate curing catalyst incorporated in the adhesive. The partially cured adhesive is resistant to running, which may help to reduce a risk of shorting the semiconductor die to be applied subsequently, relative to methods in which the electrically conductive adhesive remains uncured until the die makes contact. Partial curing also enables the polymer membrane to be stored and transported.

At 40, accordingly, the polymer membrane including the partially cured electrically conductive adhesive optionally may be stored for an indeterminate length of time and/or transported. The partial cure of the electrically conductive adhesive prevents the trace lines from running together during storage and/or transport. At 42 a semiconductor die having first and second electrical contacts is placed on the surface, such that the first and second electrical contacts overlay the partially cured electrically conductive adhesive. At 44 the partially cured electrically conductive adhesive is additionally cured to form a fully cured electrically conductive adhesive. In some examples, the additional curing may involve additional heating. At 46, an encapsulant, a cover layer, and/or other additional layer may be arranged on the surface of the polymer membrane, over the semiconductor die.

Another example provides an electronic assembly comprising a flexible polymer membrane having a surface with one or more electrically conductive traces arranged on the surface; a semiconductor die having first and second electrical contacts bonded to the one or more electrically conductive traces via a cured electrically conductive adhesive; and a flexible cover layer arranged over the surface of the polymer membrane and the semiconductor die.

In some implementations, the cover layer is at least partly transmissive to light emitted by the semiconductor die. In some implementations, the semiconductor die includes a light-emitting diode. In some implementations, the polymer membrane is comprises a fabric material. In some implementations, the cover layer comprises a fabric material. In some implementations, the cover layer includes a woven fabric. In some implementations, the cured electrically conductive adhesive is formed from an adhesive that can be partially cured. In some implementations, the semiconductor die is a light-emissive semiconductor die. In some implementations, the one or more electrically conductive traces are formed at least partially from a different material than the cured electrically conductive adhesive. In some implementations, the electronic assembly further comprises an encapsulant layer configured to cover the semiconductor die. In some implementations, the encapsulant layer comprises a color conversion material. In some implementations, the cover layer is an optically diffusive cover layer.

Another example provides a method of manufacture of an electronic assembly, the method comprising: arranging one or more electrically conductive traces on a surface of a polymer membrane; depositing an uncured electrically conductive adhesive in electrical communication with the one or more conductive traces on the surface of the polymer membrane; partially curing the uncured electrically conductive adhesive to form a partially cured electrically conductive adhesive; placing a semiconductor die having first and second electrical contacts on the surface, such that the first and second electrical contacts overlay the partially cured electrically conductive adhesive; and additionally curing the partially cured electrically conductive adhesive to form a cured electrically conductive adhesive.

In some implementations, the method further comprises arranging one or more of an encapsulant and a fabric cover layer on the surface of the polymer membrane, over the semiconductor die. In some implementations, the method further comprises transporting the polymer membrane including the partially cured electrically conductive adhesive prior to placement of the semiconductor die.

Another example provides a fabric-based electronic assembly comprising: a polymer membrane having a surface with one or more electrically conductive traces arranged on the surface; a light-emissive semiconductor die having first and second electrical contacts bonded to the one or more electrically conductive traces via a cured electrically conductive adhesive; and a cover textile arranged on the surface of the polymer membrane, over the light-emissive semiconductor die.

In some implementations, the fabric-based electronic assembly further comprises an encapsulant layer disposed between the light-emissive semiconductor die and the cover textile. In some implementations, the encapsulant layer includes a color-conversion material. In some implementations, the cover textile is a woven cover textile configured to transmit light emitted by the semiconductor die. In some implementations, the polymer membrane is one or more of a polyimide membrane and a polyethylene tetraphthalate membrane, and wherein the cured electrically conductive adhesive is one or more of a urethane adhesive and a polysiloxane adhesive.

It will be understood that the configurations and/or approaches described herein are exemplary in nature, and that these specific examples or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic assembly comprising:
a flexible polymer membrane having a surface with one or more electrically conductive traces arranged on the surface;
a semiconductor die having first and second electrical contacts bonded to the one or more electrically conductive traces via a cured electrically conductive adhesive;
an adhesive encapsulant layer arranged on the surface and configured to encapsulate the semiconductor die; and a flexible cover textile bonded to the surface and to the semiconductor die via the adhesive encapsulant layer.

2. The electronic assembly of claim 1 wherein the cover textile is at least partly transmissive to light emitted by the semiconductor die.

3. The electronic assembly of claim 1 wherein the semiconductor die includes a light-emitting diode.

4. The electronic assembly of claim 1 wherein the polymer membrane comprises a fabric material.

5. The electronic assembly of claim 1 wherein the flexible cover textile includes a woven fabric.

6. The electronic assembly of claim 1 wherein the cured electrically conductive adhesive is formed from an adhesive curable to a partially cured state.

7. The electronic assembly of claim 1 wherein the semiconductor die is a light-emissive semiconductor die.

8. The electronic assembly of claim 1 wherein the one or more electrically conductive traces are formed at least partially from a different material than the cured electrically conductive adhesive.

9. The electronic assembly of claim 1 wherein the adhesive encapsulant layer comprises a color conversion material.

10. The electronic assembly of claim 1 wherein the flexible cover textile includes an optically diffusive cover layer.

11. A fabric-based electronic assembly comprising:
a polymer membrane having a surface with one or more electrically conductive traces arranged on the surface;
a light-emissive semiconductor die having first and second electrical contacts bonded to the one or more electrically conductive traces via a cured electrically conductive adhesive;
an adhesive encapsulant layer arranged on the surface and configured to encapsulate the semiconductor die; and
a cover textile bonded to the surface and to the light-emissive semiconductor die via the encapsulant layer.

12. The fabric-based electronic assembly of claim 11 wherein the encapsulant layer includes a color-conversion material.

13. The fabric-based electronic assembly of claim 11 wherein the cover textile is a woven cover textile configured to transmit light emitted by the semiconductor die.

14. The fabric-based electronic assembly of claim 11 wherein the polymer membrane is one or more of a polyimide membrane and a polyethylene tetraphthalate membrane, and wherein the cured electrically conductive adhesive is one or more of a urethane adhesive and a polysiloxane adhesive.

* * * * *